United States Patent
Lucero et al.

(10) Patent No.: US 7,259,961 B2
(45) Date of Patent: Aug. 21, 2007

(54) RECONFIGURABLE AIRFLOW DIRECTOR FOR MODULAR BLADE CHASSIS

(75) Inventors: Christopher D. Lucero, Phoenix, AZ (US); Javier Leija, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 483 days.

(21) Appl. No.: 10/875,968

(22) Filed: Jun. 24, 2004

(65) Prior Publication Data
US 2005/0286222 A1 Dec. 29, 2005

(51) Int. Cl.
*H05K 7/20* (2006.01)

(52) U.S. Cl. ............... 361/695; 361/694; 361/696; 361/697; 361/724; 361/727; 454/184; 165/121; 312/223.2

(58) Field of Classification Search ............ 361/687, 361/690–697, 714–727, 752, 796; 174/15.1, 174/15.2, 16.1, 252; 454/184–186; 312/223.2, 312/223.3; 165/61, 80.3, 47, 122–126; 310/68 D; 379/329
See application file for complete search history.

(56) References Cited

U.S. PATENT DOCUMENTS

| | | | | |
|---|---|---|---|---|
| 2,894,728 A | * | 7/1959 | Davis ............... | 165/61 |
| 3,387,648 A | * | 6/1968 | Ward, Jr. et al. ......... | 165/47 |
| 3,592,260 A | * | 7/1971 | Berger ................ | 165/121 |
| 3,874,444 A | * | 4/1975 | Perce et al. ............ | 165/47 |
| 3,917,370 A | | 11/1975 | Thornton et al. | |
| 4,261,519 A | * | 4/1981 | Ester ................ | 239/548 |
| 4,648,007 A | * | 3/1987 | Garner ............... | 361/695 |
| 4,837,663 A | * | 6/1989 | Zushi et al. ........... | 361/695 |
| 5,202,816 A | | 4/1993 | DeWilde | |
| 5,409,419 A | | 4/1995 | Euchner et al. | |
| 5,676,199 A | | 10/1997 | Lee | |
| 5,995,368 A | * | 11/1999 | Lee et al. ............. | 361/695 |

(Continued)

FOREIGN PATENT DOCUMENTS

DE 2651015 5/1978

(Continued)

OTHER PUBLICATIONS

Office Action mailed on Dec. 28, 2006. U.S. Appl. No. 10/881,884, filed on Jun. 30, 2004.

*Primary Examiner*—Michael Datskovskiy
(74) *Attorney, Agent, or Firm*—Blakely, Sokoloff, Taylor & Zafman LLP

(57) ABSTRACT

A reconfigurable airflow director for modular blade chassis. The airflow director includes multiple duct channels having adjustable inlets and/or outlets. The airflow director may be reconfigured to adjust the amount of airflow across selected blades and selected zones on an individual blade. In one embodiment, snap-in airflow blockers are employed to block all or a portion of selected inlets or outlets to adjust the airflow through corresponding duct channels. In one embodiment, adjustable inlet vanes are employed to increase or decrease the size of adjacent inlets. In one embodiment, the airflow director is formed from multiple airflow director modules, each including an outer shell having multiple ribs extending therefrom to form multiple airflow channels, wherein the airflow director modules are stacked together to form a plurality of duct channels. Modular fan assemblies including multiple hot-swappable fans are employed to push and/or draw airflow through the duct channels of the airflow director.

29 Claims, 9 Drawing Sheets

U.S. PATENT DOCUMENTS

| | | | |
|---|---|---|---|
| 6,011,688 A * | 1/2000 | Thornburg et al. | 361/695 |
| 6,042,474 A * | 3/2000 | Harvey et al. | 454/184 |
| 6,094,919 A | 8/2000 | Bhatia | |
| 6,185,109 B1 * | 2/2001 | Koradia et al. | 361/818 |
| 6,252,770 B1 * | 6/2001 | Yu et al. | 361/695 |
| 6,289,678 B1 | 9/2001 | Pandolfi | |
| 6,326,597 B1 | 12/2001 | Lubomirsky et al. | |
| 6,326,610 B1 | 12/2001 | Muramatsu et al. | |
| 6,381,147 B1 * | 4/2002 | Hayward et al. | 361/756 |
| 6,512,672 B1 * | 1/2003 | Chen | 361/695 |
| 6,580,609 B2 | 6/2003 | Pautsch | |
| 6,646,878 B2 * | 11/2003 | Chan | 361/695 |
| 6,754,076 B2 | 6/2004 | Cox et al. | |
| 6,816,590 B2 * | 11/2004 | Pike et al. | 379/329 |
| 6,880,345 B1 | 4/2005 | Leija et al. | |
| 6,882,533 B2 | 4/2005 | Bash et al. | |
| 6,912,131 B2 * | 6/2005 | Kabat | 361/720 |
| 6,935,868 B1 | 8/2005 | Campini et al. | |
| 7,011,576 B2 * | 3/2006 | Sharp et al. | 454/184 |
| 7,097,495 B2 | 8/2006 | Sweetland | |
| 7,126,818 B2 * | 10/2006 | Lu et al. | 361/695 |
| 2002/0127900 A1 | 9/2002 | Goodwin et al. | |
| 2003/0011989 A1 | 1/2003 | Chan | |
| 2003/0062150 A1 | 4/2003 | Sweitzer et al. | |
| 2004/0008483 A1 | 1/2004 | Cheon | |
| 2004/0057211 A1 | 3/2004 | Kondo et al. | |
| 2005/0180105 A1 | 8/2005 | Matsushima et al. | |
| 2005/0241803 A1 | 11/2005 | Malone et al. | |
| 2005/0244280 A1 | 11/2005 | Malone et al. | |

FOREIGN PATENT DOCUMENTS

| | | |
|---|---|---|
| EP | 0 886 463 A | 12/1998 |
| FR | 2 699 422 A | 6/1994 |
| WO | PCT/US2005/020576 | 10/2005 |

\* cited by examiner

RECONFIGURABLE AIRFLOW DIRECTOR FOR MODULAR BLADE CHASSIS

FIELD OF THE INVENTION

The field of invention relates generally to computer and telecommunications equipment, and, more specifically but not exclusively relates to a reconfigurable airflow director for computer and telecommunication equipment chassis.

BACKGROUND INFORMATION

The Advanced Telecommunications Architecture (ATCA) (also referred to as Advanced TCA) standard defines an open switch fabric based platform delivering an industry standard high performance, fault tolerant, and scalable solution for next generation telecommunications and data center equipment. The development of the ATCA standard is being carried out within the PCI Industrial Computer Manufacturers Group (PICMG).

The Advanced TCA 3.0 base specification defines the physical and electrical characteristics of an off-the-shelf, modular chassis based on switch fabric connections between hot-swappable blades. This specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion and be guaranteed to operate. The ATCA 3.0 base specification also defines a power budget of 200 Watts (W) per board, enabling high performance servers with multi-processor architectures and multi gigabytes of on-board memory.

Although the ATCA standard is a step in the right direction with respect to providing standardized telecom and computer component interfaces and interoperability, several of its design aspects are limiting. Notably, the 200 W power dissipation per board slot places a restriction on how much heat can be generated by a board, while not defining the location of the heat sources. (It is noted the 200 W limit applies to boards occupying a single slot. Higher power dissipations are allowed for boards occupying multiple slots, e.g., a front board occupying two slots is limited to 400 W). In order to meet ever increasing bandwidth demand, equipment capabilities need to increase, requiring faster processors, among other board component improvements. When considering identical semiconductor fabrication processes, there is a direct relationship between speed and power consumption—the faster the processor speed, the greater the power consumption of the processor, and thus the greater the amount of heat that must be dissipated by an ATCA board hosting the processor. In view of the rigid board and shelf form factors defined by the ATCA base specification, this leads to problems in achieving sufficient cooling for high-power components such as processors, since the majority of the 200 W will be consumed by such components.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION OF PREFERRED EMBODIMENTS

Embodiments of apparatus and methods for enhancing cooling in computer and telecommunication equipment chassis are described herein. In the following description, numerous specific details are set forth, such as implementations corresponding to the ATCA standard, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the following paragraphs, exemplary embodiments of the invention are described within a use context targeted to ATCA equipment installations. However, this does not limit the use of the principles and teachings disclosed herein to ATCA equipment. Rather, the following embodiments are merely illustrative of one possible type of installation. In general, the principles and teachings are applicable to various types of modular electronic equipment, including, but not limited to, telecommunications equipment and computer equipment.

The majority of equipment installed in central office and data centers today is air cooled due to simplicity, relatively low cost, ease of implementation, and reliability. This trend is likely to continue into the future for the same reasons. Accordingly, the thermal guidelines defined in the ATCA specification apply to air cooling; other cooling methods are permissible, but are not covered in the specification. In general, Boards, Shelves, and Frames may be either cooled by natural convection, without the assistance of fans or blowers, or cooled by forced convection with the assistance of fans or blowers. The choice is left to the end-user requirements.

Figure 1:
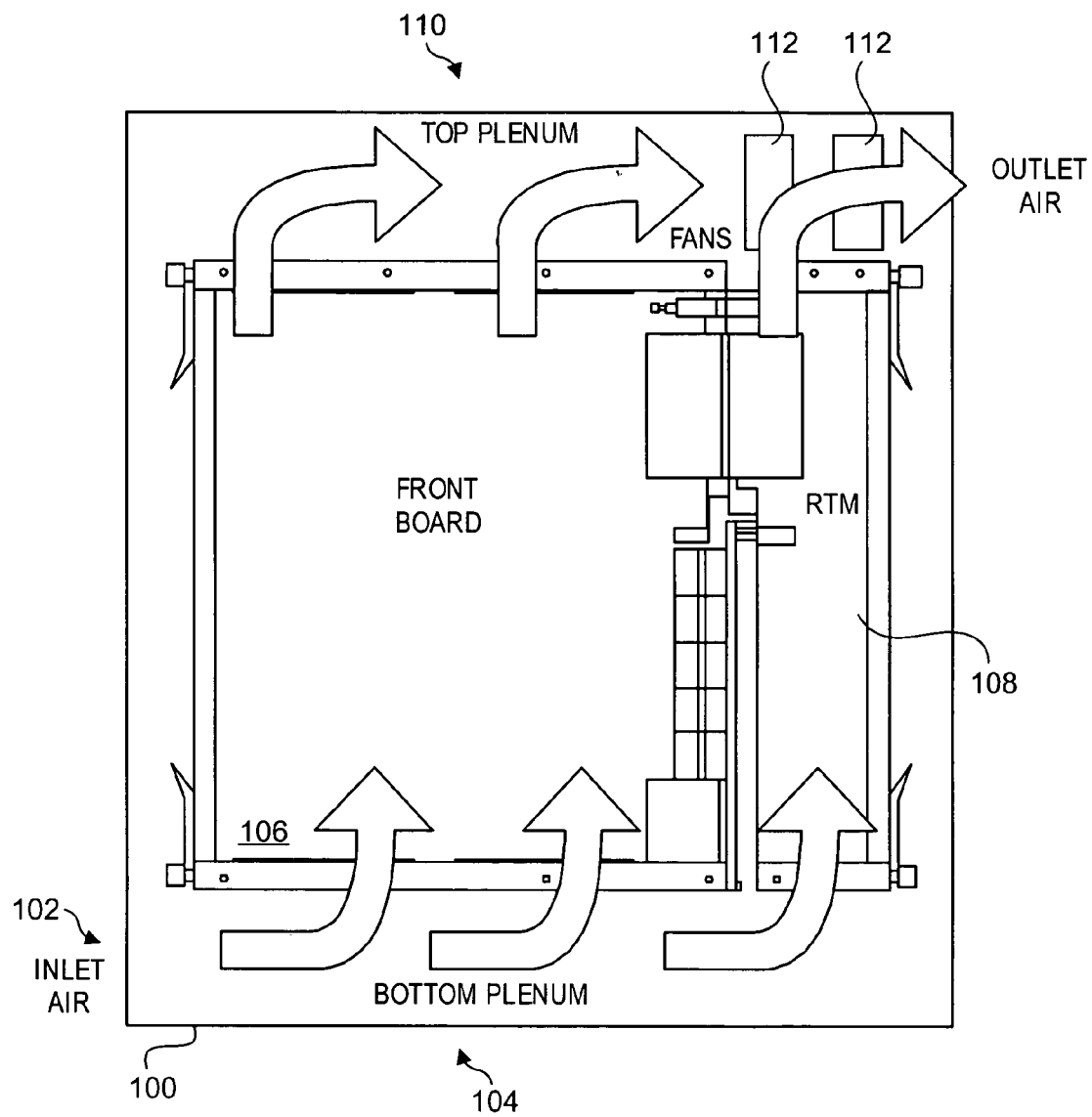
FIG. 1 is a schematic diagram of an exemplary airflow pattern defined by the ATCA (Advanced Telecommunication Architecture) standard for cooling ATCA boards.

An airflow path used as an example in the ACTA PICMG 3.0 Short Form Specification (January, 2003) is shown in FIG. 1. Air enters a Shelf 100 at in air inlet 102 at the lower front into a bottom plenum 104 and turns 90 degrees upward. Airflow across the bottom edge of a Front Board 106 and a rear transition module (RTM) 108 is evenly distributed. As the air passes across the hot components on Front Board 106 and RTM 108, heat is carried away by forced convection. The air exits the subrack at the top, is drawn into an upper plenum 110, turns 90 degrees, and is exhausted out the rear of Shelf 100 by fans 112. In addition to the illustrated configuration, other airflow paths and cooling methods are allowed under the ACTA standard.

The standard cooling configuration shown in FIG. 1 has several drawbacks. Notably, it assumes that cooling requirements for all boards are substantially equal, wherein the airflows across all boards are approximately equal. Furthermore, it does not consider "hot spots" on individual boards, but rather again using an average airflow approach. In contrast, the power consumption (and thus heat generation) within a typical ATCA chassis is uneven, with certain types of boards producing more heat that other types of boards. Furthermore, in many boards only a few components, such as processors, produce the majority of heat for the board. These components may become overheated if not provided with adequate airflow.

In accordance with aspects of the embodiments described herein, enhanced cooling is facilitated through use of a reconfigurable airflow director that can be selectively configured to supply higher airflow to high-power components and boards, while providing lower airflow to low-power components and boards. In view of the modular design concept advanced by the ACTA and other standards, the airflow director may be included as part of a modular ducting apparatus that may be used in a standard ACTA rack.

Figure 2:
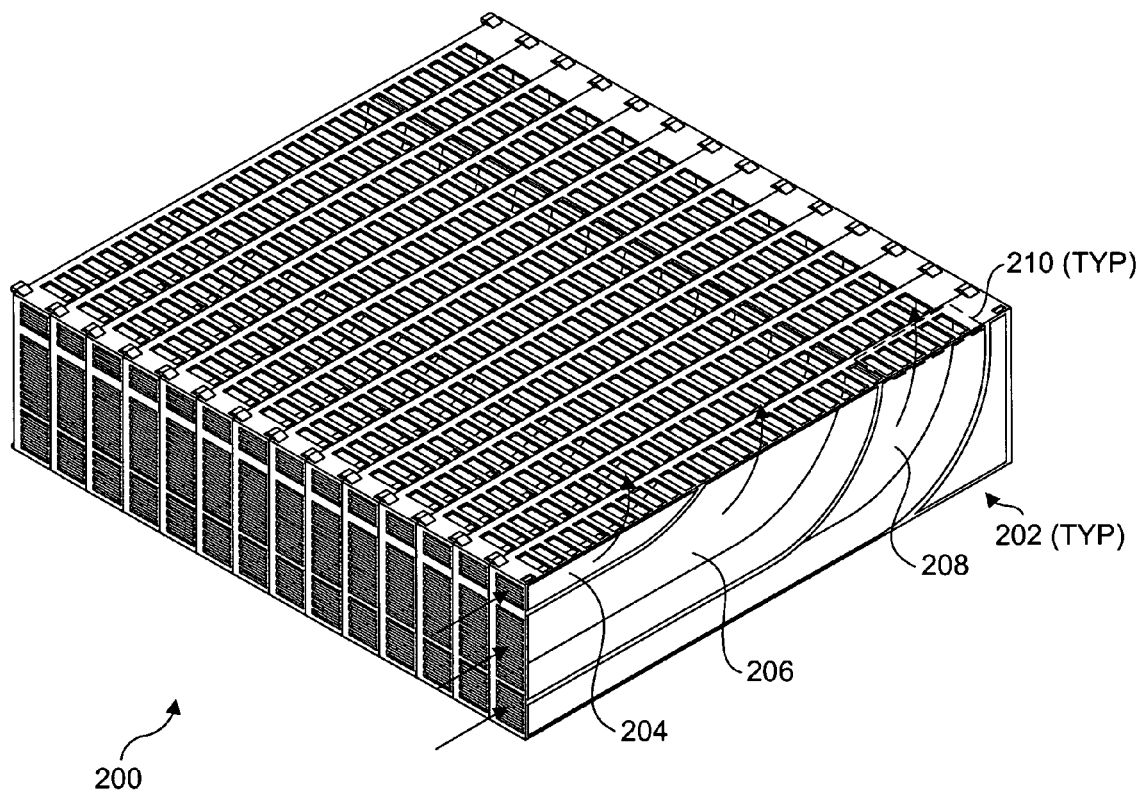
FIG. 2 is an isometric view of a reconfigurable airflow director that may be adjusted to selectively vary airflow across ATCA boards, according to one embodiment of the invention.

An overall view of a reconfigurable airflow director 200, according to one embodiment, is shown in FIG. 2. The airflow director comprises an assembly formed by coupling a plurality of airflow director modules 202 together, further details of which are shown in FIGS. 3a-b and 4a-b. Each airflow director module includes multiple airflow channels via which air is redirected from an inlet side to an outlet side of the airflow director. In the illustrated embodiment, each of airflow director modules 202 includes three airflow channels 204, 206, and 208. However, this is merely exemplary, as other numbers of airflow channels may be employed. Upon being coupled together, each airflow channel becomes a duct channel. Thus, airflow director 202 contains a multitude of duct channels 210 that are used to selectively direct air more effectively to various areas of an ATCA chassis in which the air director is installed. The various duct channels can be selectively blocked (either partially or completely) to reduce airflow across components receiving airflow from those duct channels. This enables airflow across selected boards, and even across zones on selected boards to be varied to more efficiently use the airflow produced by fans that are used to draw and/or push air through the various duct channels of the airflow director.

In one embodiment, there is a set of duct channels for each respective slot in the chassis in which the airflow director is installed. For example, one ATCA chassis form factor provides 14 slots for up to 14 single-width ATCA boards. Accordingly, the embodiment of airflow director 202 in FIG. 2 includes 14 sets of duct channels 210, formed by coupling together 14 airflow director modules 202.

Figure 3A:
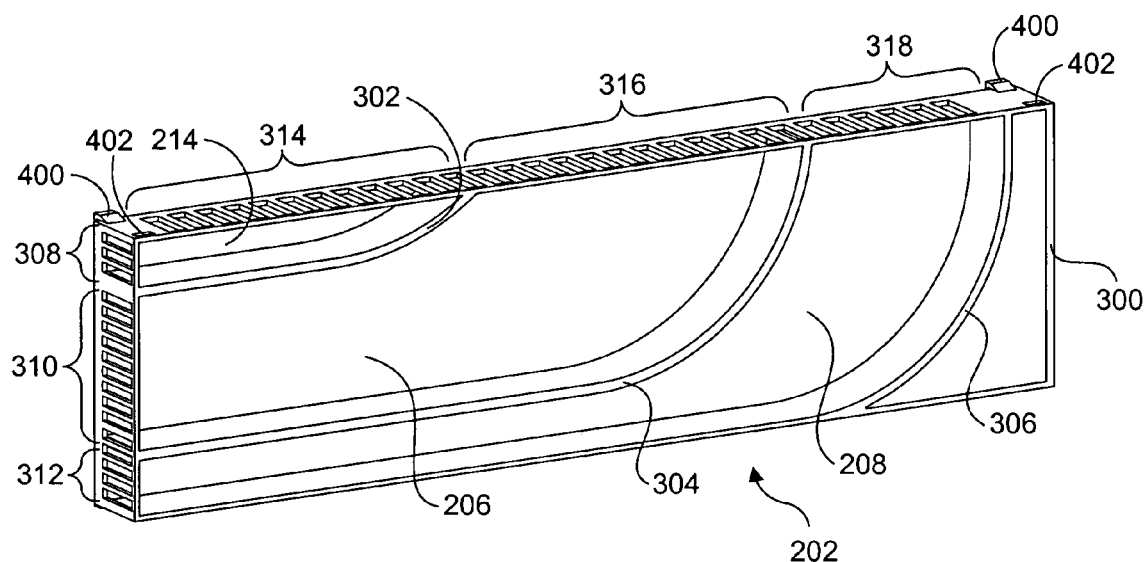
FIG. 3a is a front isometric view of an airflow director module used to form the airflow director of FIG. 2.
Figure 3B:
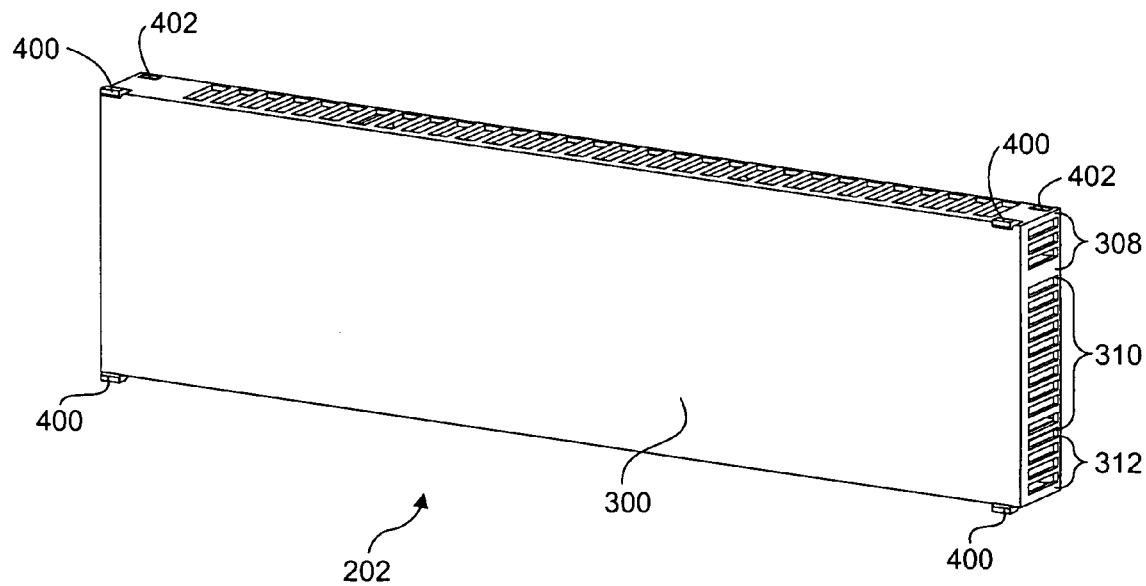
FIG. 3b is a rear isometric view of the airflow director module of FIG. 3b.

Details of one embodiment of airflow director module 202 are shown in FIGS. 3a-b, 4a-b, and 5a-b. The airflow director module comprises an outer shell 300 having a plurality of internal ribs that are used to form the airflow channels. In one embodiment, the outer shell is substantially rectangular in configuration. In the embodiment of FIG. 3a, the internal ribs include ribs 302, 304, and 306. The ribs will generally have a curvilinear shape to redirect airflow received at inlets 308, 310, and 312 and exiting at outlets 314, 316, and 318.

Figure 4A:
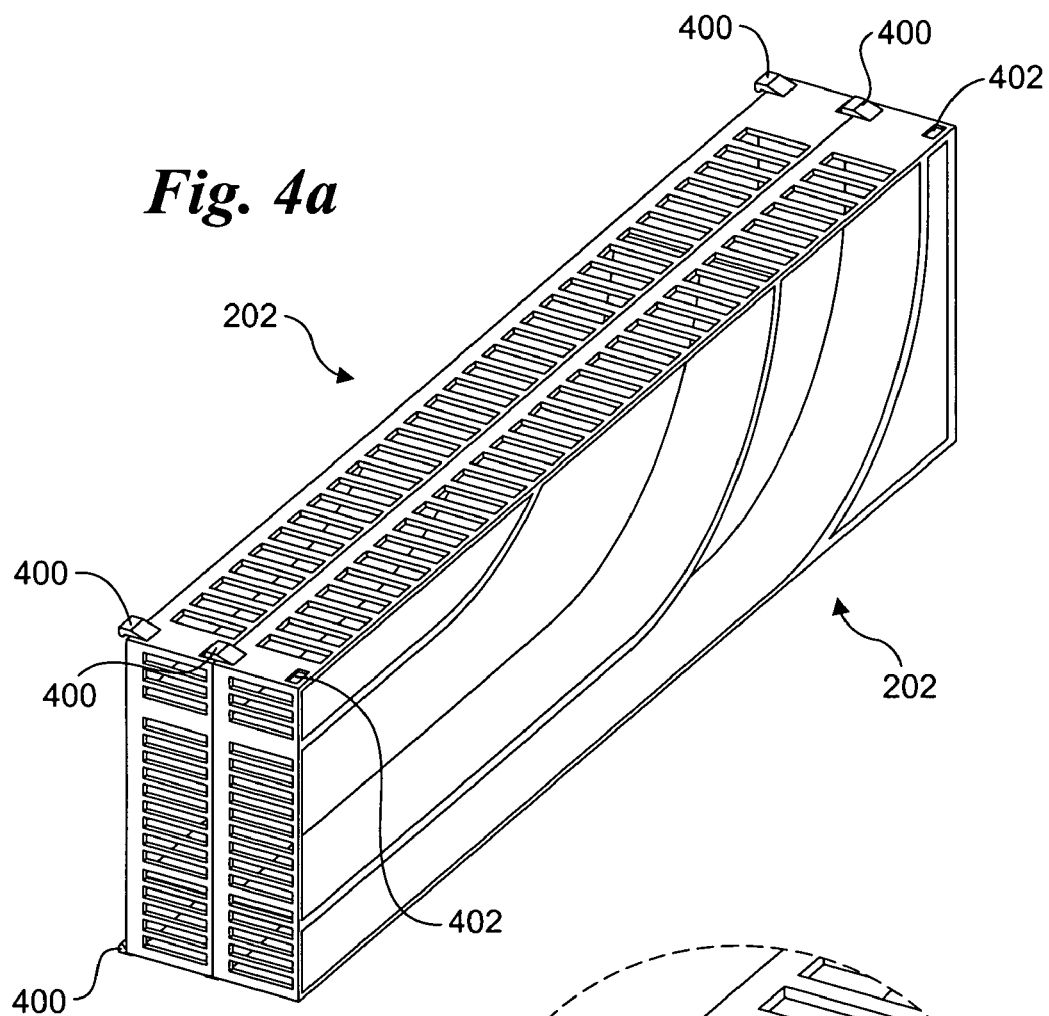
FIG. 4a is an isometric view of a pair of airflow director modules.
Figure 4B:
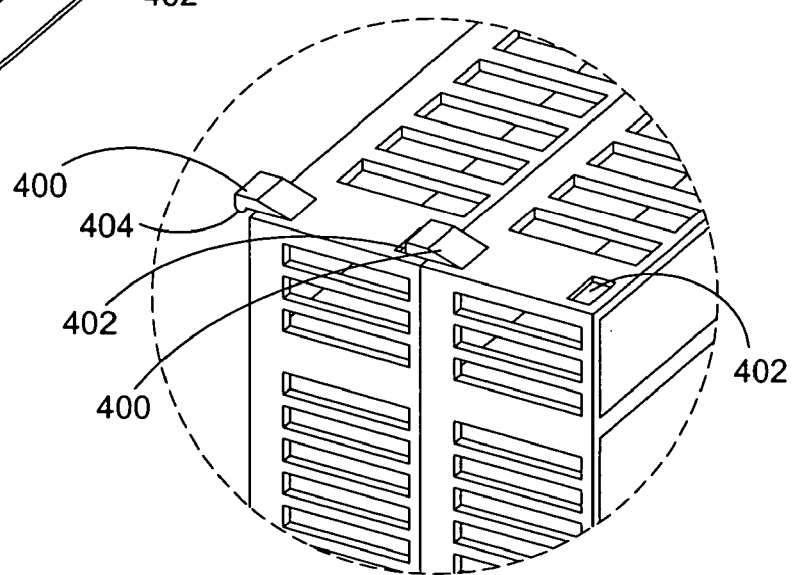
FIG. 4b is a close-up isometric view illustrating details of a coupling mechanism used to couple a airflow director modules together.

Details of a coupling mechanism used for coupling airflow director modules 202 together are shown in FIGS. 4a and 4b. Each airflow director module 202 includes four engagement tabs 400 that are configured to engage four mating tab recesses 402. Each engagement tab 400 includes a protrusion 404 that engages a respective mating tab recess 402 upon coupling a pair of airflow director modules 202 together.

Figure 5A:
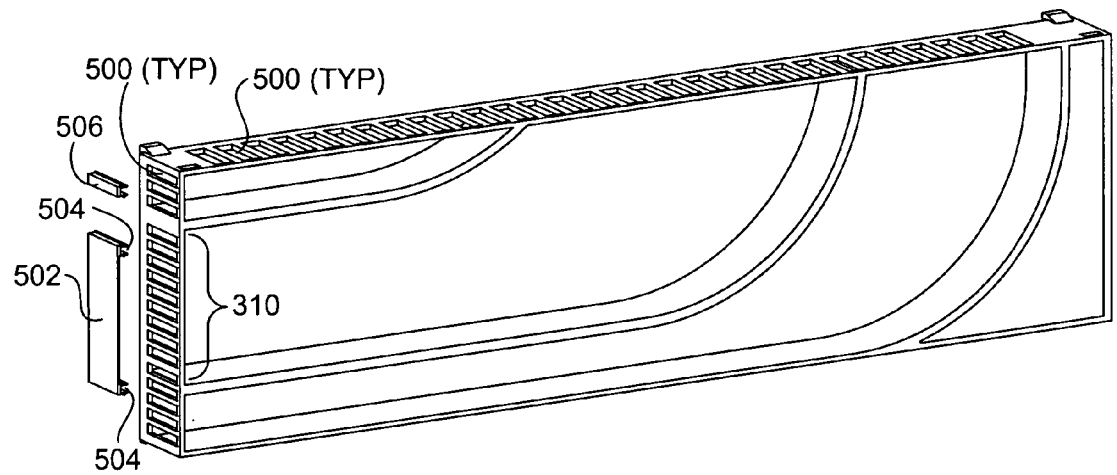
FIGS. 5a and 5b are isometric views of an airflow director module and a pair of snap-in blockers that are used to block selected portions of an air director inlets.
Figure 5B:
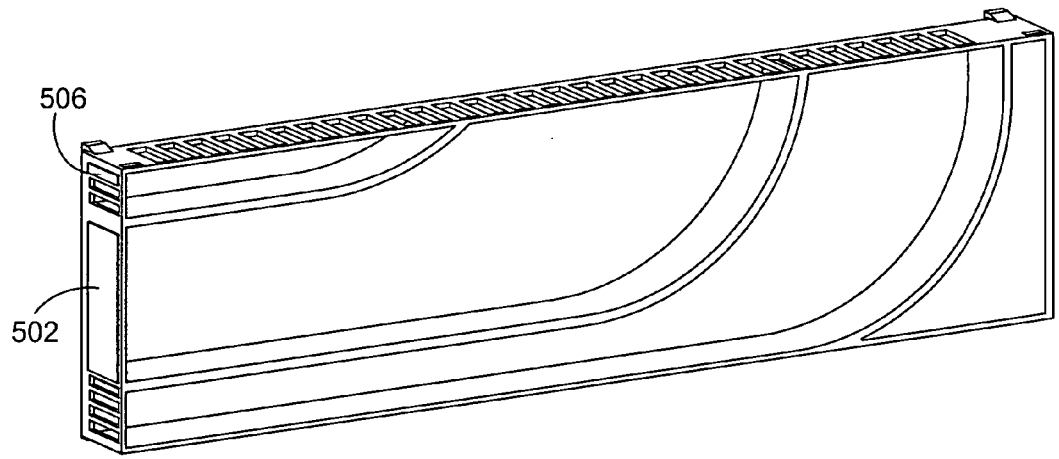

As discussed above, embodiments of airflow director 200 may provide a mechanism for selectively blocking all or a portion of selected duct channels. In one embodiment, airflow director 200 includes multiple slots 500 disposed in the various inlets and outlets of the duct channels, as shown in FIGS. 5a and 5b. The slots generally may be configured to server multiple purposes. In one respect, the slots provide a stiffening function, increasing the strength of the individual airflow director modules 202 and thus the assembled airflow director 200.

In another respect, the slots on the outlet side of the airflow director may be configured to generate turbulence in the airflow exiting the slots, thus enhancing heat transfer via turbulent forced-convection airflow. In addition to the slots, other means may be used to generate turbulence in the airflow exiting the airflow director outlets. For example, bumps or the like may be formed in the sidewall of an airflow director module.

Another purpose of slots 500 is to provide an engagement means via which snap-in airflow blockers may be installed. For example, FIGS. 5a and 5b respectively show exemplary snap-in airflow blockers 502 and 506 before and after installation in an airflow director module 202. The snap-in airflow blocker 502 includes one or more engagement tabs 504 at each end of the airflow blocker that engage respective slots in the airflow director module using a snapping action.

Generally, the width of a snap-in airflow blocker may vary, depending on the portion of an inlet or outlet that the blocker is designed to block. For example, a snap-in blocker may be used to block a portion of an inlet or outlet spanning one or more slots. For example, snap-in blocker 502 is configured to block the entirety of inlet 310, while single-slot snap-in block 506 is configured to block a single slot. In addition, the width and number of slots shown in the Figures herein are merely exemplary. In general, the slots may be evenly-spaced, or have variable spacing. Furthermore, all or a portion of a given inlet or outlet may include a single opening with no slots.

Depending on the particular cooling requirements for a system, various slots 500 may be selectively blocked using appropriately-sized snap-in airflow blockers. In general, snap-in airflow blockers will be used to block inlets when air is pushed into the air director inlets. When air is drawn into the inlets (e.g., using fans located at the top of a chassis), the snap-in airflow blockers may be installed so that selected portions of the inlets or outlets are blocked.

Under an alternative airflow-adjustment technique, one or more of the airflow director modules includes adjustable inlet vanes. For example, details of an airflow director module 202A including adjustable inlet vanes 600 and 602. Each inlet vane is pivotally coupled to a respective rib 604 and 606 via a pivot 608. In one embodiment, a pair of opposing stub shafts are formed in an inlet vane to provide the pivot axes, where the opposing stub shafts engage mating recesses in the rib to which the inlet vane is pivotally coupled. In another embodiment, a shaft is inserted through holes formed in the inlet van and the rib.

In general, various schemes may be used to enable an inlet vane to be repositioned. In the illustrated embodiment of FIGS. 6*a-c*, multiple detents 610 are formed in outer shell 300A. A mating protrusion is formed in one (as illustrated) or both (not shown) sides of each inlet vane. The protrusion, inlet vane, and pivot are configured to allow an inlet vane to be repositioned to engage a selected detent 610. In general, an airflow director module that employs adjustable inlet vanes may or may not include slots that are analogous to slots 500 (which in this instance would be used for stiffening purposes).

Figure 6A:
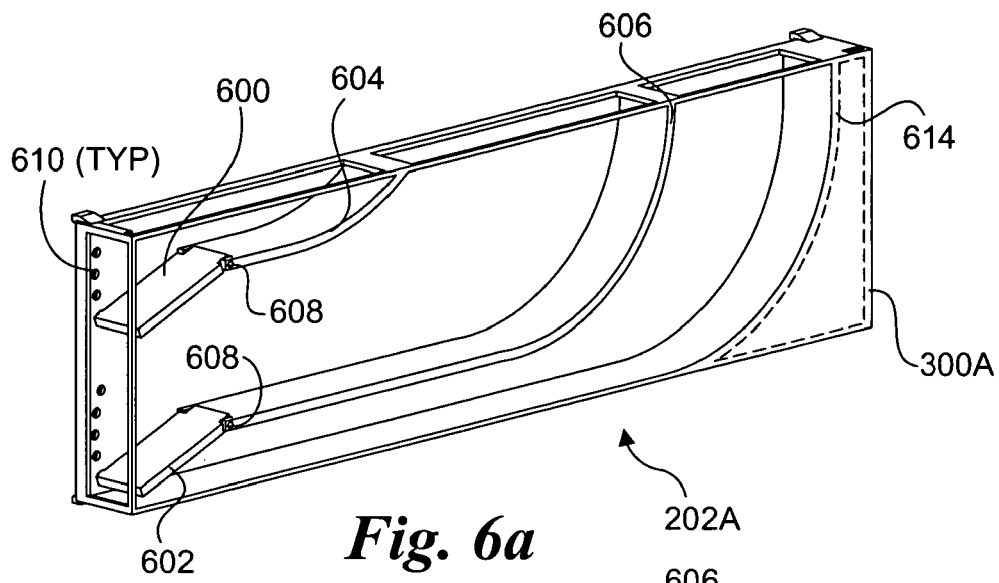
FIGS. 6a and 6b are front isometric views of an airflow director module including adjustable inlet vanes that may be repositioned to vary airflow across selected portions of an ATCA board.
Figure 6B:
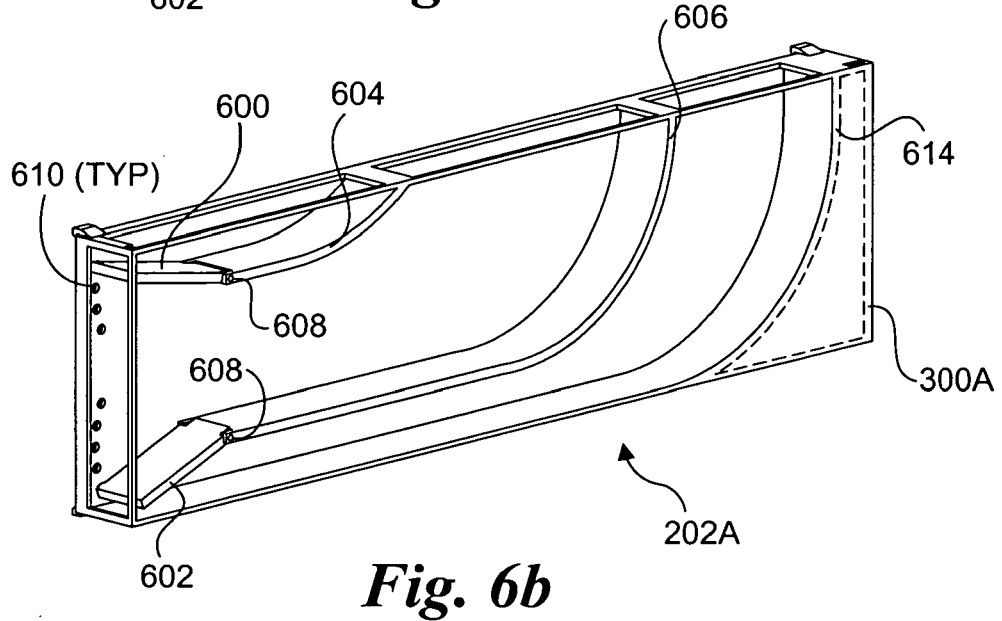
Figure 6C:
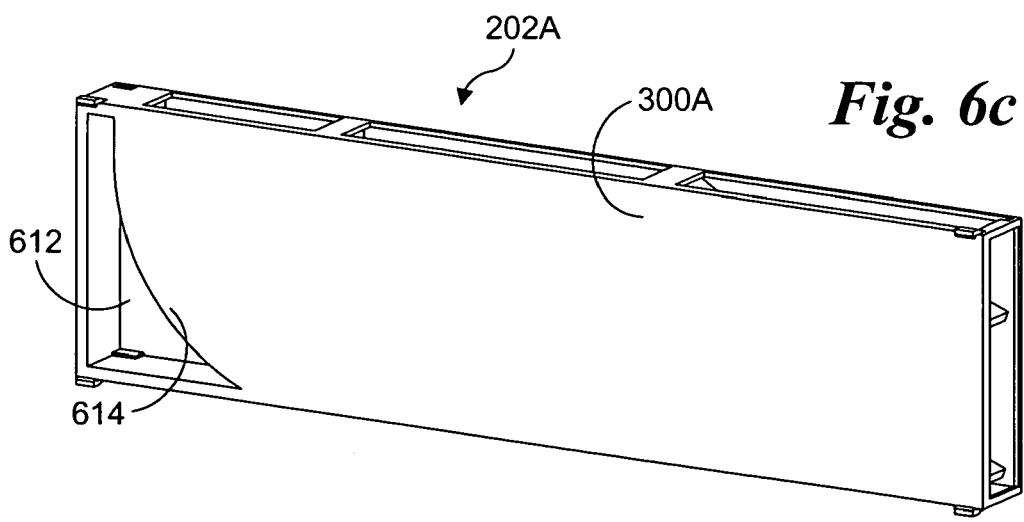
FIG. 6c is a rear isometric view of the airflow director module of FIGS. 6a and 6b.

As shown in FIG. 6C, a cavity 612 is formed in the backside of outer shell 300A, such that a rib 614 is formed between the back of outside shell 300A and a shelf 616 formed in the front-side of the shell. It is noted that a similar configuration may be employed for airflow director module 202.

In general, airflow director modules 202 and 202A may be formed of a suitable plastic or metal. In one embodiment, a plastic airflow director module is formed using an injection molding process, as is known in the art. Other plastic molding techniques may also be employed, such as, but not limited to, vacuum forming and roto-molding. Metal airflow director modules may generally be formed using conventional metal forming techniques, such as casting and forging, for example.

Figure 7A:
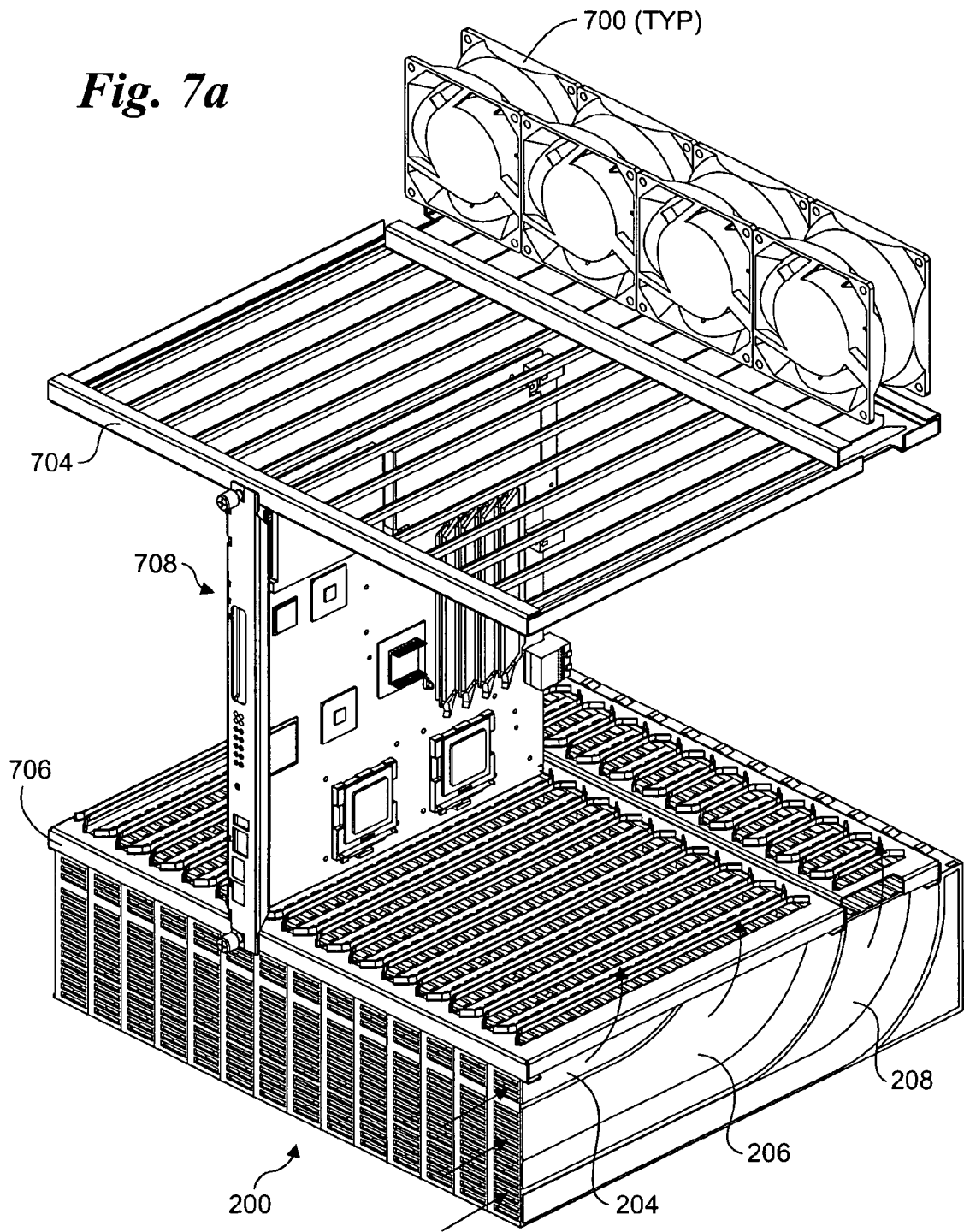
FIGS. 7a and 7b are isometric views of selected portions of an ATCA chassis in which the airflow director of FIG. 1 may be implemented, wherein the embodiment of FIG. 7a shows a configuration including a first set of hot-swappable fans used to draw air through the airflow director and the embodiment of FIG. 7b further includes a second set of hot-swappable fans used to push air through the airflow director.
Figure 7B:
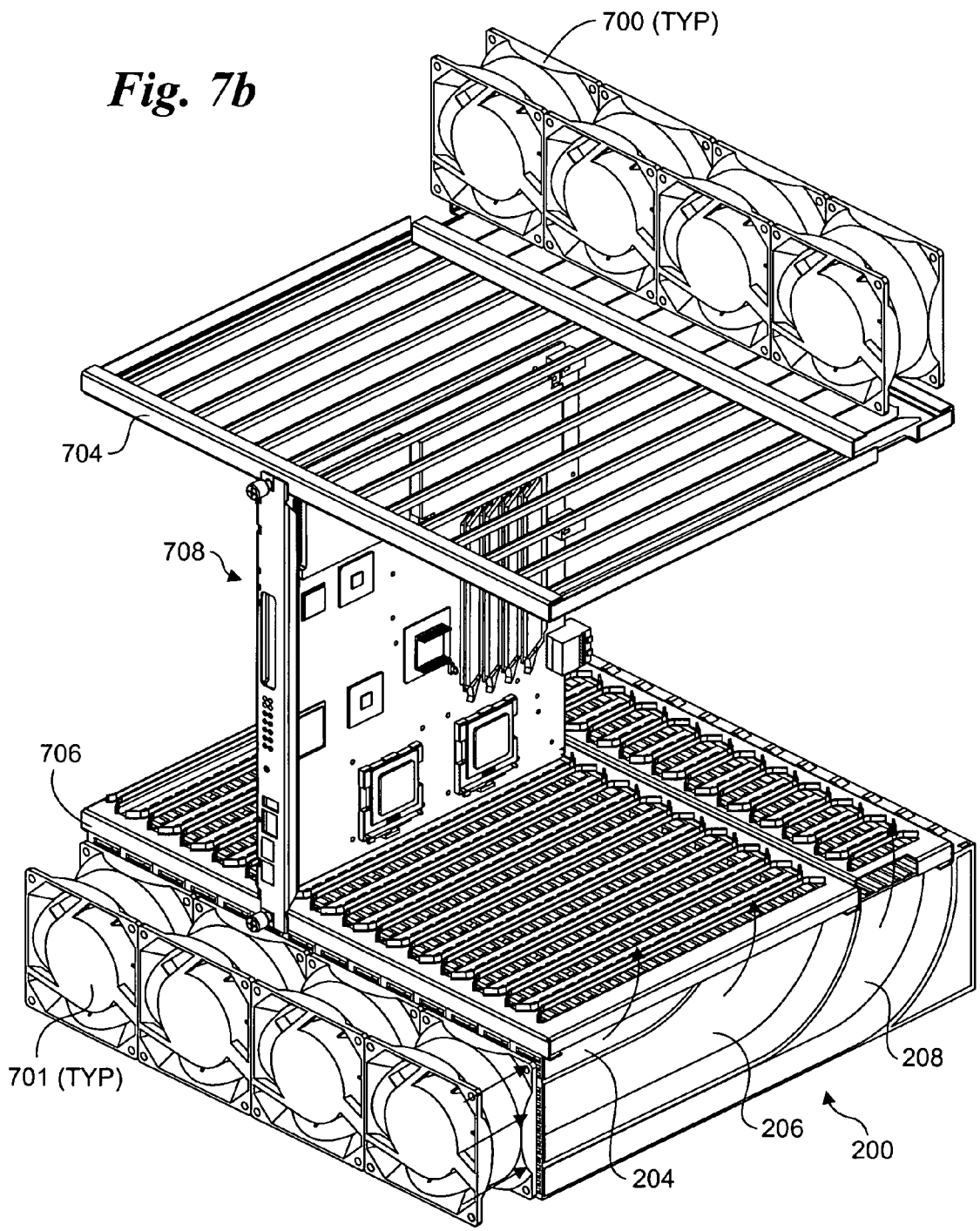
Figure 7C:
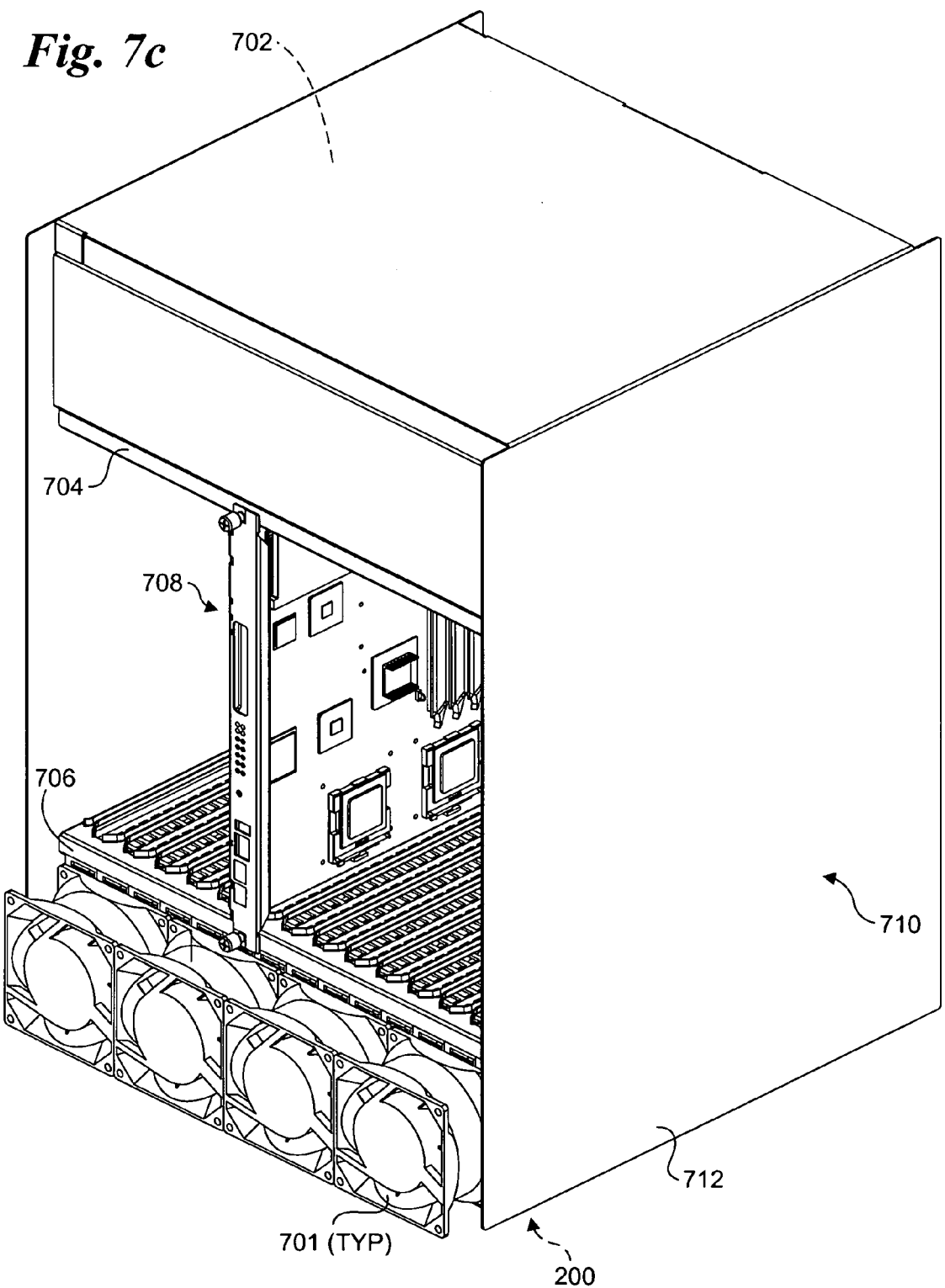
FIG. 7c is an isometric view of an ATCA chassis corresponding to the embodiment of FIG. 7b.

Exemplary implementations of airflow director 200 for an ATCA chassis are shown in FIGS. 7*a-c*. For purposes of clarity, selected portions of the ATCA chassis has been removed n FIGS. 7*a* and 7*b*. A substantially complete chassis is shown in FIG. 7*c*.

FIG. 7*a* illustrates the airflow for an ATCA chassis configuration that includes a plurality of axial fans 700 located toward the outlet of a top plenum 702 (see FIG. 7*c*). This configuration is referred to as a "draw-through" configuration, as air is drawn through the various duct channels of airflow director 200 by creating a slight vacuum on the outlet side of the airflow director. In one embodiment, axial fans 700 are part of a modular fan assembly that includes multiple "hot-swappable" fans, meaning a failed fan may be replaced without removing power to the other fans.

In FIGS. 7*b* and 7*c*, an additional set of axial fans 701 are located toward the lower front of an ATCA chassis 710 to push air into the inlet side of airflow director 200. This configuration is referred to as a "push-through" configuration, as air is pushed into the inlet side of airflow director 200 by axial fans 701. It is noted that a combination of a push-through and draw-through configuration exist when both axial fans 700 and 701 are installed. In one embodiment, axial fans 701 are part of a modular fan assembly that includes multiple hot-swappable fans.

In addition to the axial fans depicted in the figures herein, other types of fans may be used. For example, one or more centrifugal fans may employed in place of or in addition to axial-type fans.

The ATCA chassis 710 includes top and bottom slot guides 704 and 706 used to guide the installation of an ATCA front board 708. In general, multiple ATCA front boards will be installed in a given ATCA chassis under a typical ATCA installation. For clarity, only a single ATCA front board is depicted in FIGS. 7*a-c*. Furthermore, the ATCA front boards will be coupled to a backplane, which is also not shown in FIGS. 7*a-c* for clarity. Additionally, typically one or more RTMs (also not shown) will be coupled to the backplane.

As illustrated in FIGS. 7*a* and 7*b*, airflow channels 204 and 206 are used to direct airflow over the ATCA front boards, while airflow channels 208 are used to direct airflow over the RTMs. Accordingly, it may be desired to block all or a portion of an inlet 312 (see, e.g., FIG. 3*a*) for slots that do not employ an RTM when pushing air through the various inlets, such as illustrated by the push-through configurations of FIGS. 7*b* and 7*c*. For implementations in which air is drawn through the airflow director, such as illustrated by the draw-through configuration of FIG. 7*a*, all or a portion of an outlet 318 may be blocked for a slot without an RTM. Similarly, it may be advantageous to block all or a portion of inlets 308 and 310 for an empty front-board slot (i.e., an empty slot that is configured to receive an ATCA front board) for push-through configurations, while blocking all or a portion of outlets 314 and 316 for draw-through configurations.

Similar types of adjustments can be produced when using an airflow director that includes one or more of airflow director modules 202A shown in FIGS. 6*a-c*. In this instance, the inlet vanes 600 and 602 may be adjusted to redirect the airflow in a desired manner. In general, the adjustment of the inlet vanes will be similar for both push-through and draw-through configurations.

In one embodiment, airflow director 200 comprises an assembly module that may be easily removed, readjusted, and re-installed in an ATCA chassis. For example, the airflow director may be installed in a shelf coupled to the lower portion of the ATCA chassis. Under one embodiment, a side panel 712 of ATCA chassis 710 is used to function as a cover plate for the first airflow director module 202 in the airflow director assembly, thereby forming duct channels in this first airflow director module.

In addition, one or more filter elements may be placed at the inlet and/or outlet sides of the airflow director. Such filter elements are not shown in the Figures herein for clarity.

In addition to the exemplary ATCA chassis implementations discussed above and illustrated in the Figures herein, the general principles and teachings of the foregoing embodiments may be implemented for various types of cooling systems that are designed to direct airflow over one or more circuit boards. A non-exhaustive list of exemplary implementations include computer servers (e.g., blade servers), medical equipment (e.g., ultrasound machines), and telecommunication equipment (e.g., switches, routers, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An airflow director, comprising:
a plurality of airflow director modules, each including an outer shell having a plurality of ribs extending therefrom forming airflow channels there between, the airflow director modules stacked together to form a plurality of duct channels, each duct channel having an airflow inlet to receive airflow supplied at an inlet side of the airflow director and an airflow outlet to exhaust airflow passing through the duct channel at an outlet side of the airflow director, the airflow outlets configured in a grid having at least two rows and two columns.

2. The airflow director of claim 1, wherein at least a portion of the duct channels have adjustable airflow inlets to enable airflow to those airflow inlets to be adjusted.

3. The airflow director of claim 2, wherein the adjustable airflow inlets comprise adjustable inlet vanes that may be rotated to adjust the size of adjacent airflow inlets.

4. The airflow director of claim 1, further comprising a plurality of airflow blockers, each airflow blocker sized to at least partially block one of an airflow inlet or airflow outlet to reduce airflow through a corresponding duct channel.

5. The airflow director of claim 4, wherein an airflow blocker is coupled to an inlet or outlet using a snap mechanism.

6. The airflow director of claim 1, wherein the airflow inlets are disposed substantially perpendicular to the airflow outlet.

7. The airflow director of claim 1, wherein the airflow inlets are configured in a grid.

8. The airflow director of claim 1, wherein the airflow director modules are coupled to one another using a plurality of snap-fit couplings.

9. The airflow director of claim 1, wherein the airflow director is configured to be employed as a bottom plenum in an ATCA (Advanced Telecommunications Architecture) chassis.

10. The airflow director of claim 1, further comprising:
a fan assembly mounted to the inlet side of the airflow director, including at least one fan to direct airflow into the airflow inlets.

11. An apparatus, comprising:
plenum means, including,
a plurality of duct channels, each duct channel having an airflow inlet to receive airflow supplied at an inlet side of the plenum means and an airflow outlets to exhaust airflow passing through the duct channel at an outlet side of the plenum means, the airflow outlets configured in a grid having at least two rows and two columns; and
means for adjusting an amount of airflow passing through selected duct channels.

12. The apparatus of claim 11, further comprising:
means for providing airflow at the inlet side of the plenum means, operatively coupled to the plenum means.

13. The apparatus of claim 12, wherein the means for providing airflow at the inlet side of the plenum means comprises a modular fan assembly including a plurality of hot swappable fans.

14. The apparatus of claim 11, wherein the plenum means is formed from a plurality of airflow director modules, each including an outer shell having a plurality of ribs extending therefrom forming airflow channels therebetween, the airflow director modules stacked together to form a plurality of duct channels.

15. The apparatus of claim 14, further comprising:
means for coupling the plurality of airflow director modules to one another.

16. The apparatus of claim 11, further comprising:
means for generating turbulence in airflow exiting at least a portion of the airflow outlets.

17. The apparatus of claim 11, further comprising:
means for at least partially blocking airflow passing through selected duct channels.

18. A system, comprising:
a chassis, to hold a plurality of blades;
a top plenum, coupled to a top of the chassis;
a bottom plenum, coupled to a bottom of the chassis, the bottom plenum including a plurality of airflow director modules, each including an outer shell having a plurality of ribs extending therefrom forming airflow channels there between, the airflow director modules stacked together to form a plurality of duct channels, each duct channel having an airflow inlet to receive airflow supplied at an inlet side of the bottom plenum and an airflow outlet to exhaust airflow passing through the duct channel at an outlet side of the bottom plenum into the chassis, the airflow outlets configured in a grid having at least two rows and two columns.

19. The system of claim 18, wherein at least a portion of the duct channels have adjustable airflow inlets to enable airflow to those airflow inlets to be adjusted.

20. The system of claim 18, further comprising:
a fan assembly mounted to the inlet side of the bottom plenum, including at least one fan to direct airflow into the airflow inlets.

21. The system of claim 20, wherein the fan assembly comprises a modular fan assembly including a plurality of hot swappable fans.

22. The system of claim 18, further comprising:
at least one fan, operatively coupled to the top plenum, to draw airflow through the inlets of the bottom plenum and through the chassis.

23. The system of claim 18, wherein the chassis comprises an ATCA (Advanced Telecommunications Architecture) chassis.

24. The system of claim 18, further comprising a plurality of airflow blockers, each airflow blocker sized to at least partially block one of an airflow inlet or airflow outlet to reduce airflow through a corresponding duct channel.

25. A method, comprising:
coupling a bottom plenum to an modular blade chassis having a plurality of slots in which respective blades may be installed, the bottom plenum including a plurality of duct channels, each duct channel having an airflow inlet to receive airflow supplied at an inlet side of the bottom plenum and an airflow outlet to exhaust airflow passing through the duct channel at an outlet side of the bottom plenum into the modular blade chassis, the airflow outlets configured in a grid having at least two rows and two columns;

adjusting selected duct channels to direct additional airflow over hotspots on selected blades in the modular blade chassis relative to other portions of the modular blade chassis producing less heat; and performing at least one of pushing and pulling airflow through the plurality of duct channels to pass airflow across the plurality of blades.

26. The method of claim 25, further comprising:
adjusting selected duct channels to adjust airflow across different zones on a selected blade.

27. The method of claim 25, further comprising:
blocking at least a portion of an inlet or outlet for a selected duct channel to decrease airflow through that duct channel.

28. The method of claim 25, further comprising:
supplying airflow into the inlet side of the bottom plenum via a fan assembly including a plurality of hot-swappable fans.

29. The method of claim 25, wherein the modular blade chassis comprises an ATCA (Advanced Telecommunications Architecture) chassis.

* * * * *